United States Patent
Mounioloux

(10) Patent No.: US 9,927,181 B2
(45) Date of Patent: Mar. 27, 2018

(54) RADIATOR WITH INTEGRATED PUMP FOR ACTIVELY COOLING ELECTRONIC DEVICES

(71) Applicant: Rouchon Industries, Inc., Long Beach, CA (US)

(72) Inventor: Stephen Mounioloux, Long Beach, CA (US)

(73) Assignee: Rouchon Industries, Inc.

( * ) Notice: Subject to any disclaimer, the term of this patent is extended or adjusted under 35 U.S.C. 154(b) by 0 days.

(21) Appl. No.: 13/934,184

(22) Filed: Jul. 2, 2013

(65) Prior Publication Data
US 2013/0299139 A1    Nov. 14, 2013

Related U.S. Application Data

(63) Continuation-in-part of application No. 12/969,284, filed on Dec. 15, 2010.
(Continued)

(51) Int. Cl.
*F28D 1/04*    (2006.01)
*F28D 1/053*    (2006.01)
(Continued)

(52) U.S. Cl.
CPC .......... *F28D 1/04* (2013.01); *F28D 1/05375* (2013.01); *G06F 1/20* (2013.01); *H01L 23/467* (2013.01);
(Continued)

(58) Field of Classification Search
CPC .......... F28D 1/04; F28D 1/05375; G06F 1/20; G06F 1/203; G06F 1/206; F28F 2250/08; H01L 23/473
(Continued)

(56) References Cited

U.S. PATENT DOCUMENTS 3,810,509 A   5/1974   Kun
4,834,628 A * 5/1989   Laing .................... F04D 29/20
                                                    417/420
(Continued)

FOREIGN PATENT DOCUMENTS

EP      0610826 A2    8/1994
JP      2006234255  *  9/2006
(Continued)

OTHER PUBLICATIONS

Osanawa, JP2006234255 (English Translation), Sep. 2006.*

*Primary Examiner* — Len Tran
*Assistant Examiner* — Eric Ruppert
(74) *Attorney, Agent, or Firm* — Waller Lansden Dortch & Davis, LLP; Matthew C. Cox

(57) ABSTRACT

An integrated cooling apparatus for actively cooling one or more electronic components in an electronic device such as a computer is provided. The cooling apparatus includes a radiator and a pump integrally mounted on the radiator. The pump can include a pump housing having a first pump housing member attached to the radiator and a second pump housing member detachably securable to the first pump housing member. The apparatus includes a flow inlet and a flow outlet for attaching hoses or conduits to the radiator for actively moving a liquid coolant to and from an external or remote heat exchanger via tubing. An external heat exchanger can be fluidly connected to the integrated cooling apparatus via two or more tubes and thermally attached to the electronic component to be cooled, such as a computer graphics card, microprocessor or other circuit component.

20 Claims, 15 Drawing Sheets

Related U.S. Application Data

(60) Provisional application No. 61/286,571, filed on Dec. 15, 2009.

(51) Int. Cl.
*G06F 1/20* (2006.01)
*H01L 23/467* (2006.01)
*F28D 21/00* (2006.01)

(52) U.S. Cl.
CPC .. *F28D 2021/0031* (2013.01); *F28F 2250/08* (2013.01); *G06F 2200/201* (2013.01); *H01L 2924/0002* (2013.01)

(58) Field of Classification Search
USPC .............. 165/80.4, 71, 174, 104.19; 361/699
See application file for complete search history.

(56) References Cited

U.S. PATENT DOCUMENTS

| | | | |
|---|---|---|---|
| 5,316,077 A | 5/1994 | Reichard | |
| 5,441,102 A | 8/1995 | Burward-Hoy | |
| 5,566,745 A | 10/1996 | Hill et al. | |
| 5,708,564 A | 1/1998 | Lin | |
| 5,731,954 A | 3/1998 | Cheon | |
| 5,763,951 A | 6/1998 | Hamilton et al. | |
| 5,784,257 A | 7/1998 | Tata | |
| 5,825,622 A | 10/1998 | Rife et al. | |
| 5,890,880 A | 4/1999 | Lustwerk | |
| 5,901,037 A | 5/1999 | Hamilton et al. | |
| 6,019,165 A | 2/2000 | Batchelder | |
| 6,114,827 A | 9/2000 | Alvaro | |
| 6,166,907 A | 12/2000 | Chien | |
| 6,170,563 B1 | 1/2001 | Hsieh | |
| 6,196,003 B1 | 3/2001 | Macias et al. | |
| 6,234,240 B1 | 5/2001 | Cheon | |
| 6,263,957 B1 | 7/2001 | Chen et al. | |
| 6,305,463 B1 | 10/2001 | Salmonson | |
| 6,343,478 B1 | 2/2002 | Chang | |
| 6,408,630 B2 | 6/2002 | Macias et al. | |
| 6,408,937 B1 | 6/2002 | Roy | |
| 6,415,860 B1 | 7/2002 | Kelly et al. | |
| 6,447,270 B1 | 9/2002 | Schmidt et al. | |
| 6,551,734 B1 | 4/2003 | Simpkins et al. | |
| 6,580,610 B2 | 6/2003 | Morris et al. | |
| 6,668,911 B2 | 12/2003 | Bingler | |
| 6,702,002 B2 | 3/2004 | Wang | |
| 6,725,682 B2 | 4/2004 | Scott | |
| 6,749,012 B2 | 6/2004 | Gwin et al. | |
| 6,796,370 B1 | 9/2004 | Doll | |
| 6,856,509 B2 | 2/2005 | Lin | |
| 6,892,802 B2 | 5/2005 | Kelly et al. | |
| 6,945,315 B1 | 9/2005 | Gektin et al. | |
| 6,952,345 B2 | 10/2005 | Weber et al. | |
| 6,967,841 B1 | 11/2005 | Chu et al. | |
| 6,972,954 B2 | 12/2005 | Minamitani et al. | |
| 7,055,581 B1 | 6/2006 | Roy | |
| 7,215,546 B2 | 5/2007 | Hata et al. | |
| 7,298,617 B2 | 11/2007 | Campbell et al. | |
| 7,325,588 B2 | 2/2008 | Malone et al. | |
| 7,325,591 B2 | 2/2008 | Duan et al. | |
| 7,359,197 B2 | 4/2008 | Stefanoski et al. | |
| 7,527,085 B2 | 5/2009 | Iijima et al. | |
| 7,971,632 B2 | 7/2011 | Eriksen | |
| 8,240,362 B2 | 8/2012 | Eriksen | |
| 8,245,764 B2 | 8/2012 | Eriksen | |
| 2003/0010050 A1 | 1/2003 | Scott | |
| 2003/0056939 A1 | 3/2003 | Chu et al. | |
| 2003/0131974 A1 | 7/2003 | Ellison et al. | |
| 2003/0151895 A1 | 8/2003 | Zuo | |
| 2004/0042176 A1 | 3/2004 | Niwatsukino et al. | |
| 2004/0052048 A1 | 3/2004 | Wu et al. | |
| 2004/0052049 A1 | 3/2004 | Wu et al. | |
| 2004/0105232 A1 | 6/2004 | Ito et al. | |
| 2005/0051317 A1 | 3/2005 | Chin et al. | |
| 2005/0052847 A1 | 3/2005 | Hamman | |
| 2005/0061482 A1 | 3/2005 | Lee et al. | |
| 2005/0069432 A1 | 3/2005 | Tomioka | |
| 2005/0083656 A1 | 4/2005 | Hamman | |
| 2005/0183848 A1 | 8/2005 | Cheng et al. | |
| 2006/0018775 A1* | 1/2006 | Oikawa | F04B 53/08 417/423.14 |
| 2006/0051222 A1* | 3/2006 | Lee et al. | 417/423.14 |
| 2006/0090888 A1* | 5/2006 | Huang et al. | 165/174 |
| 2006/0113066 A1 | 6/2006 | Mongia et al. | |
| 2006/0169440 A1 | 8/2006 | Chou et al. | |
| 2007/0034353 A1 | 2/2007 | Liu et al. | |
| 2007/0110592 A1* | 5/2007 | Liu et al. | 417/313 |
| 2008/0105407 A1 | 5/2008 | Yeh et al. | |
| 2008/0128114 A1* | 6/2008 | Lai et al. | 165/80.4 |
| 2008/0169086 A1* | 7/2008 | Hu | F28D 1/05366 165/80.4 |
| 2009/0044929 A1* | 2/2009 | Yeh et al. | 165/104.19 |

FOREIGN PATENT DOCUMENTS

| | | |
|---|---|---|
| WO | 200125881 A2 | 4/2001 |
| WO | 2005045654 A2 | 5/2005 |
| WO | 2006119761 A1 | 11/2006 |

* cited by examiner

RADIATOR WITH INTEGRATED PUMP FOR ACTIVELY COOLING ELECTRONIC DEVICES

CROSS-REFERENCES TO RELATED APPLICATIONS

This application is a continuation-in-part of U.S. patent application Ser. No. 12/969,284 filed Dec. 15, 2012, which claims priority to U.S. Provisional Patent Application No. 61/286,571 filed Dec. 15, 2009 by Applicant Stephen Mounioloux of Long Beach, Calif., entitled "A Radiator with Integrated Pump for Water Cooled Computer Systems," all of which are both hereby incorporated by reference in their entireties.

BACKGROUND OF THE INVENTION

Technical Field

The present invention relates generally to active cooling systems and more particularly to liquid heat exchanger systems for removing heat from electronic components and devices.

Background Art

Consumer electronic devices such as personal computers commonly utilize microprocessors and other circuit components that generate heat. Such circuit components can include for example central processing units, video graphics processing units, chip sets and memory modules. During use, heat generated within these circuit components must be removed to avoid both damage to the electronic device and reduction in device performance.

Conventional active cooling systems have been developed to extract heat from circuit components in electronic device applications such as personal computers. Such conventional active cooling systems can include the use of fans mounted on or near a circuit component to force air across the circuit component or across a heat exchanger mounted to the circuit component. Forced convection can transfer heat away from the circuit component in these conventional systems. Another conventional active cooling system includes the use of a closed-loop fluid circuit including a cooling fluid, a fluid reservoir, a pump, a heat exchanger or radiator and a contact block. The contact block generally includes the region where the cooling fluid engages in thermal contact with the heat generating circuit component, i.e. a central processing unit, microprocessor, graphics card, etc. Also, in such conventional systems, movement of the cooling fluid through the closed-loop system is provided by an external pump.

In many applications, the space surrounding the circuit component to be cooled inside the electronic device does not provide adequate room for a closed-loop active liquid cooling system. Thus, it may be necessary to position one or more cooling system components outside the electronic device housing where there is sufficient space. This type of system can be referred to as remote cooling.

One problem associated with conventional active remote cooling systems of this nature involves the use of numerous individual components. For example, some conventional systems include a pump coupled to a reservoir, a heat exchanger, and a contact block engaging the circuit feature to be cooled, wherein each system component is connected by one or more conduits or hoses. This type of system requires at least three connection hoses—an outlet hose extending from the heat exchanger to the pump, a delivery hose extending from the pump to the contact block, and an inlet hose extending from the contact block back to the heat exchanger. Each hose end must be securely connected to a system component, leading to at least six hose connection locations. Such conventional designs requiring three hoses and a standalone pump undesirably add complexity and potential leakage locations to the active cooling system.

Another problem associated with some conventional active liquid cooling systems for electronic devices includes the placement of the inlet and outlet orifices in the heat exchanger. For example, U.S. Pat. No. 6,234,240 to Cheon teaches a fanless cooling system for a computer having a reservoir with an inlet opening generally positioned at a higher elevation than the exit opening. By positioning an opening in the reservoir at a relatively high elevation on the electronic device, such conventional devices create an enhanced possibility of damage to circuit components if a leak should develop at the elevated opening position during use.

Another problem associated with conventional active liquid cooling systems for electronic devices is placement of all cooling system components inside the electronic device. Such internal system component placement can require disassembly of the electronic device if replacement, repair or alteration of any individual component is necessary. Disassembly of the electronic device in such instances can be time consuming and costly and can increase the likelihood of damage to other system components or the electronic device itself during disassembly.

What is needed then are additional improvements in the devices and associated methods of actively cooling circuit components in electronic devices using closed loop liquid circulation systems.

BRIEF SUMMARY

One embodiment of the present invention provides an integrated cooling apparatus for actively cooling one or more computer components using a liquid coolant. The apparatus includes a radiator having an integrated pump attached to the radiator, wherein the radiator and the integrated pump form a one-piece unit. The radiator includes a radiator housing having first and second longitudinal tubes defining a tube gap between the first and second longitudinal tubes. The first longitudinal tube includes a first flow direction, and the second longitudinal tube includes a second flow direction. In some embodiments, the first and second flow directions are substantially opposite. A plurality of heat exchanger fins is transversely disposed across the tube gap between the first and second longitudinal tubes.

Another embodiment of the present invention provides a heat exchanger apparatus for removing heat from an electronic device using a liquid coolant. The apparatus includes a radiator operable to receive the liquid coolant, the radiator including first and second longitudinal tubes, and the radiator including a flow inlet. The apparatus also includes a plurality of heat exchanger fins positioned adjacent the first and second longitudinal tubes. A plenum defining a plenum cavity is disposed between the first and second longitudinal tubes. A pump housing is attached to the radiator, and the pump housing includes an upper pump housing member and a lower pump housing member. The upper pump housing member defines a flow outlet positioned for ejecting liquid coolant from the radiator. A collection reservoir is disposed below the second longitudinal tube, and an outlet chamber is positioned between the collection reservoir and the flow outlet. A reservoir wall is disposed in the pump housing between the collection reservoir and the outlet chamber. The reservoir wall defines a port hole therein positioned for allowing passage of liquid coolant from the collection reservoir to the outlet chamber.

A further embodiment of the present invention provides a heat exchanger apparatus for actively cooling a circuit component in a computer. The apparatus includes a radiator including a flow inlet. The radiator also includes a first plurality of longitudinal tubes defining a first flow direction and a second plurality of longitudinal tubes defining a second flow direction. A plurality of heat exchanger fins extend between adjacent longitudinal tubes. A pump is integrally disposed on the radiator, and the pump includes a pump housing defining a flow outlet and a collection reservoir positioned between the second plurality of longitudinal tubes and the flow outlet. The pump housing defines an outlet chamber disposed between the collection reservoir and the flow outlet.

It is therefore a general object of the invention to provide a heat exchanger apparatus having an integrated pump for providing a one-piece cooling apparatus that can be used interchangeably with different cooling blocks.

Another object of the present invention is to provide a heat exchanger apparatus with an integral reservoir for reducing the number of components of the cooling system.

A further object of the present invention is to provide an active cooling system for removing heat from a circuit component of an electronic device requiring only a cooling block and a heat exchanger with an integral pump, wherein only two hoses are required for creating a closed loop system.

Yet another object of the present invention is to provide a heat exchanger apparatus with an integral pump that can be mounted on the exterior or interior of a computer enclosure.

An additional object of the present invention is to provide a heat exchanger apparatus with an integral two-part pump housing including an upper pump housing member integrally attached to a radiator and a detachable lower pump housing member that can be removed for accessing the pump housing interior.

Numerous other objects, features and advantages of the present disclosure will be readily apparent to those skilled in the art upon a reading of the following description when taken in conjunction with the accompanying drawings.

DETAILED DESCRIPTION

Figure 1:
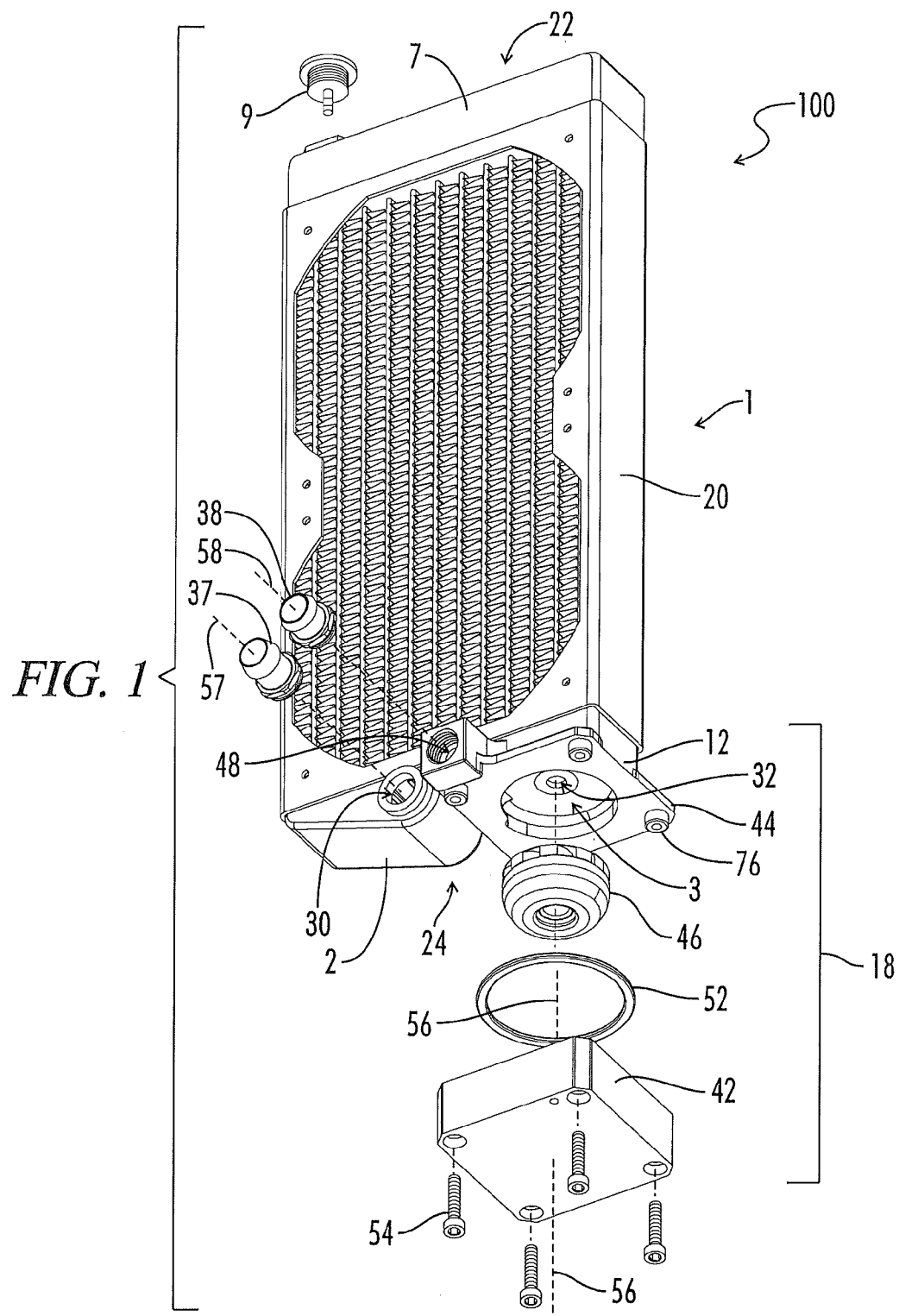
FIG. 1 illustrates a partially exploded perspective view of an embodiment of an integrated cooling apparatus with a radiator and an integrated pump in accordance with the present invention.

Referring now to the drawings and particularly to FIG. 1, an integrated cooling apparatus for actively cooling one or more circuit components on an electronic device using a liquid coolant is generally illustrated in a partially exploded perspective view and is designated by the numeral 100. In the drawings, not all reference numbers are included in each drawing, for the sake of clarity. In addition, positional terms such as "upper," "lower," "side," "top," "bottom," "vertical," "horizontal," etc. refer to the apparatus when in the orientation shown in the drawing. The skilled artisan will recognize that cooling systems and components in accordance with the present disclosure can assume different orientations when in use.

Figure 2:
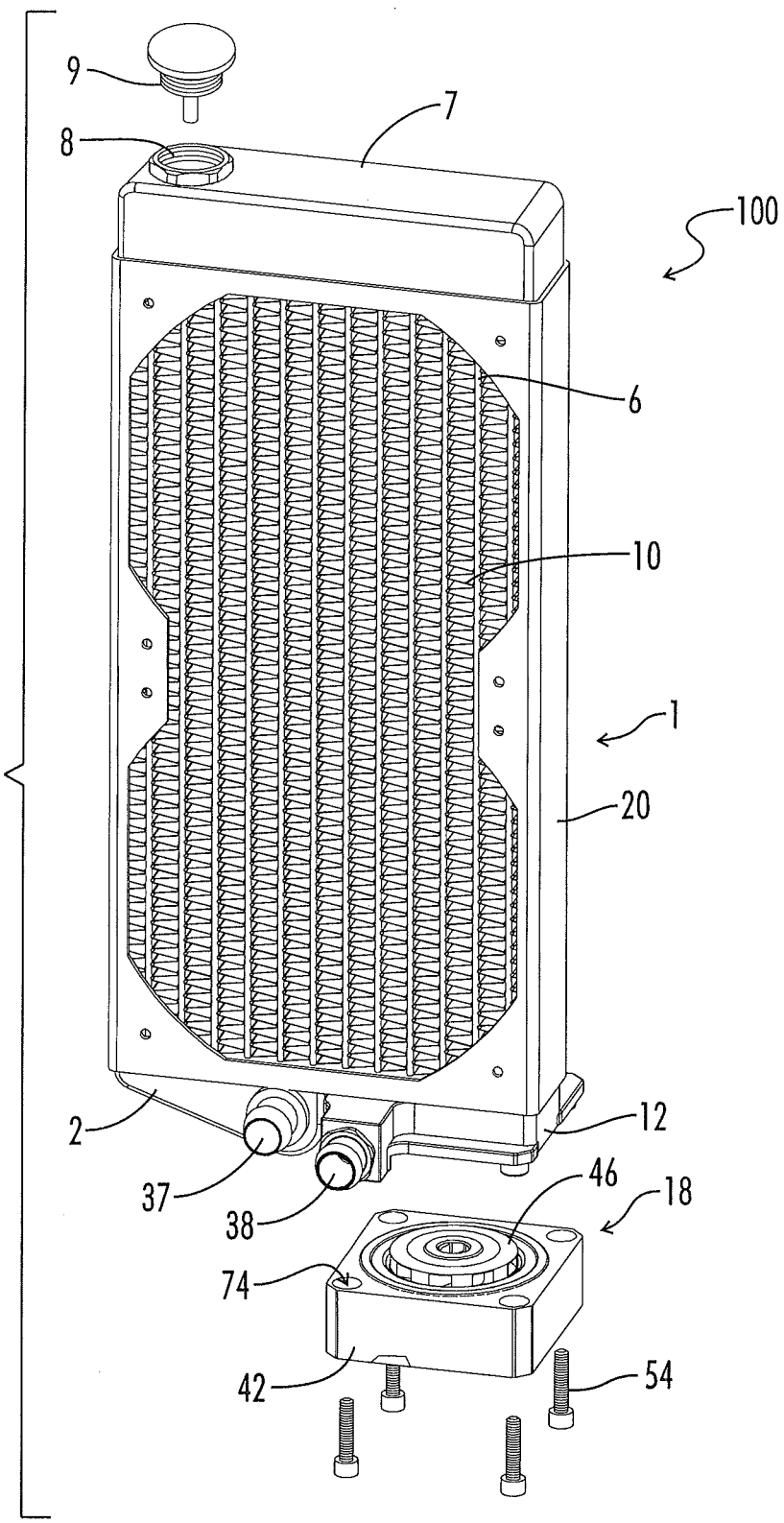
FIG. 2 illustrates a partially exploded perspective view of the embodiment of an integrated cooling apparatus of FIG. 1.
Figure 3:
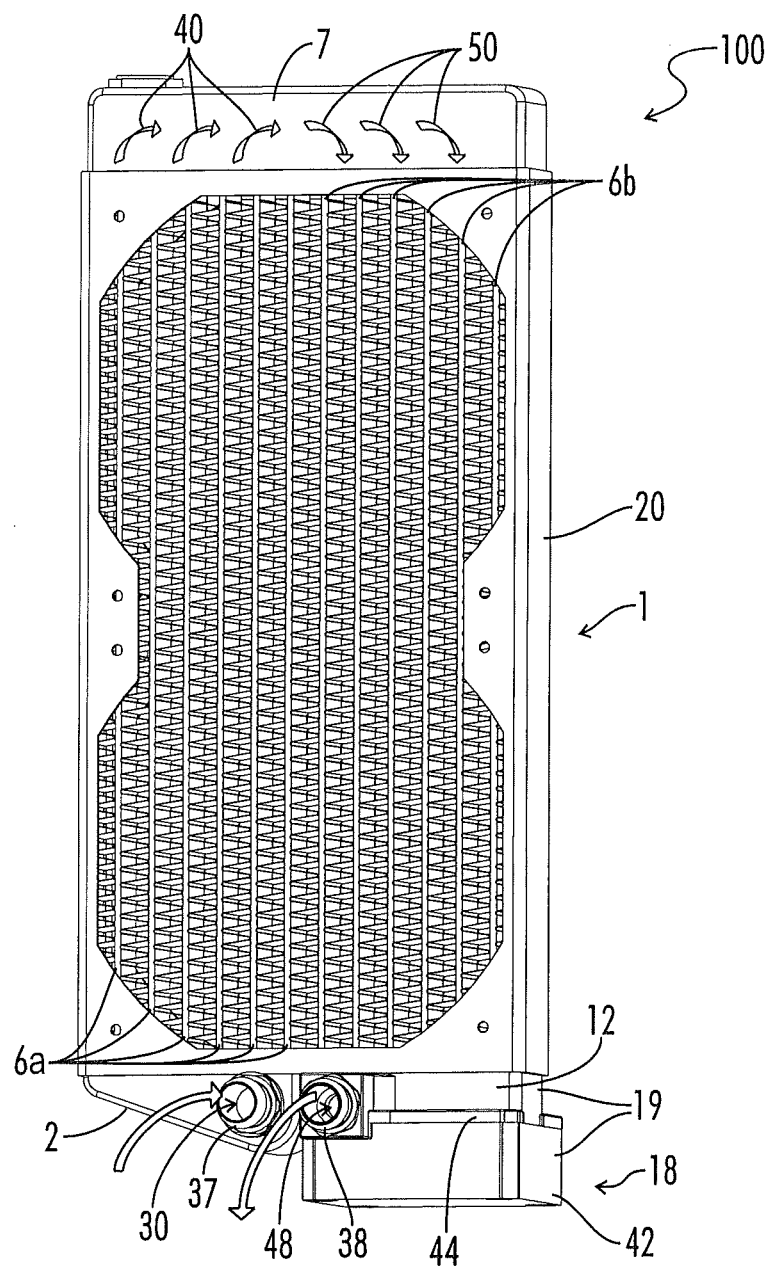
FIG. 3 illustrates a perspective view of the embodiment of the integrated cooling apparatus of FIG. 1.

Referring further to FIGS. 1-3, cooling system 100 includes a radiator 1 and an integrated pump 18. Pump 18 is said to be integrated because radiator 1 and pump 18 together form a one-piece unit that can be attached to or removed from an electronic device, such as a computer, using one or more mechanical fasteners. Radiator 1, along with integrated pump 18, thus forms an integrated cooling system that includes a plug-and-play functionality with a variety of models of external cooling blocks for electronic device cooling applications. For example, various conventional external liquid cooling blocks, cooling plates or liquid heat exchangers can be mounted on the electronic component or components to be cooled. Such conventional cooling blocks or cooling plates can be interchangeably connected to integrated cooling apparatus 100 of the present invention because radiator 1 and integrated pump 18 are provided as a single unit.

Figure 4:
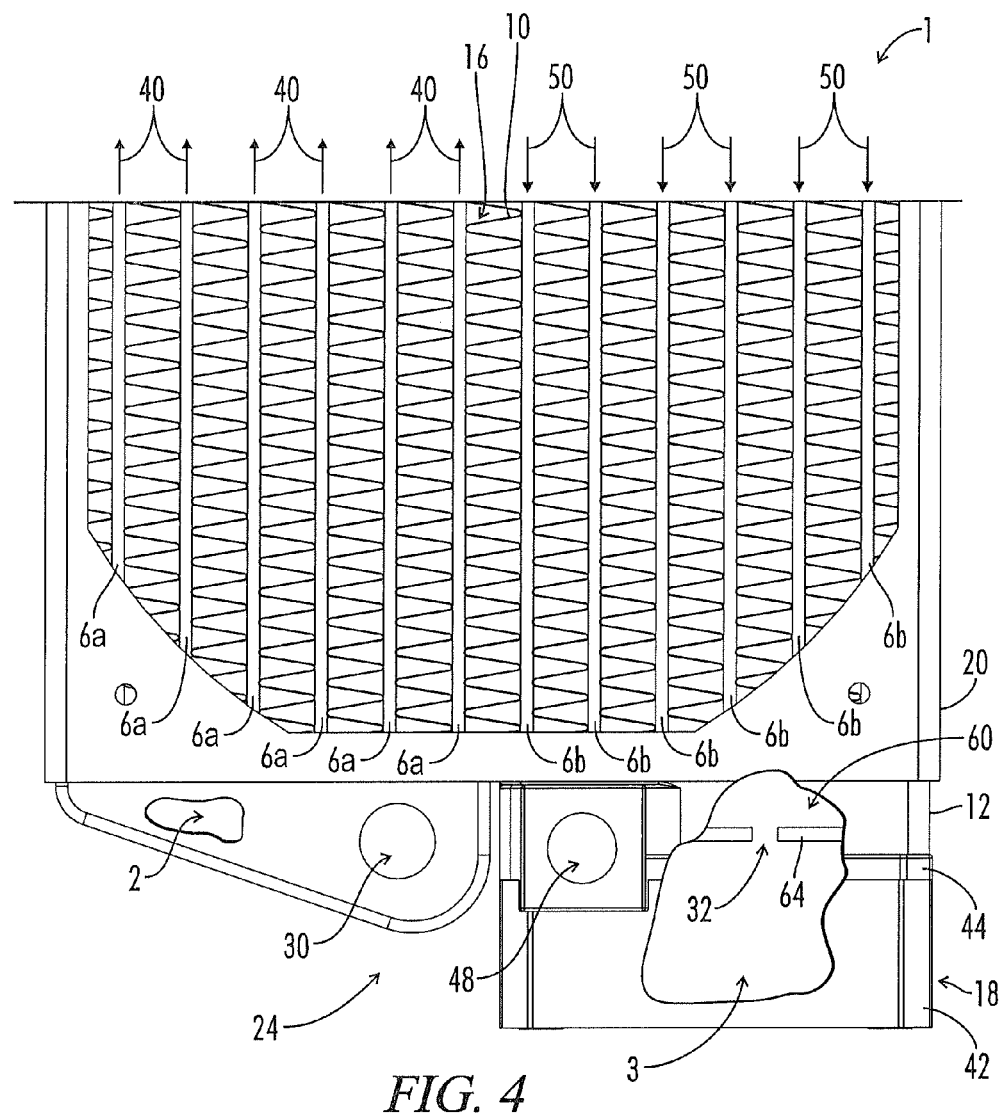
FIG. 4 illustrates a partially broken away front elevation view of an embodiment of an integrated cooling apparatus including a radiator and integrated pump housing in accordance with the present invention.

As seen in FIG. 4, radiator 1 includes a radiator housing 20 having one or more first longitudinal tubes 6a and one or more second longitudinal tubes 6b. Tubes 6a and 6b are said to be longitudinal because each tube generally defines a tube aspect ratio wherein the tube length is greater than the tube diameter. The number of first longitudinal tubes 6a and the number of second longitudinal tubes 6b can be varied depending on several factors, including for example but not limited to the required level of heat extraction, the performance characteristics of pump 18 and the available space on the electronic device for mounting radiator 1. In some embodiments, radiator 1 includes a first plurality of longitudinal tubes 6a and a second plurality of longitudinal tubes 6b, as seen in FIG. 4. In other embodiments, radiator 1 includes only one first longitudinal tube 6a and only one second longitudinal tube 6b to minimize radiator profile (not shown). Referring further to FIG. 4, in some embodiments, radiator 1 includes five or more first longitudinal tubes 6a and five or more second longitudinal tubes 6b.

A tube gap 16 is defined between at least one first longitudinal tube 6a and at least one second longitudinal tube 6b. One or more heat exchanger fins 10 are transversely disposed across tube gap 16 between the adjacent longitudinal tubes. Each heat exchanger fin 10, as seen in FIG. 4, can be positioned at an angle relative to adjacent tubes. Each heat exchanger fin 10 generally spans the tube gap between adjacent tubes so that air or another gas can be passed through radiator 1 across the surfaces of heat exchanger fins 10 and tubes 6a, 6b for convecting heat away from radiator 1.

Figure 9:
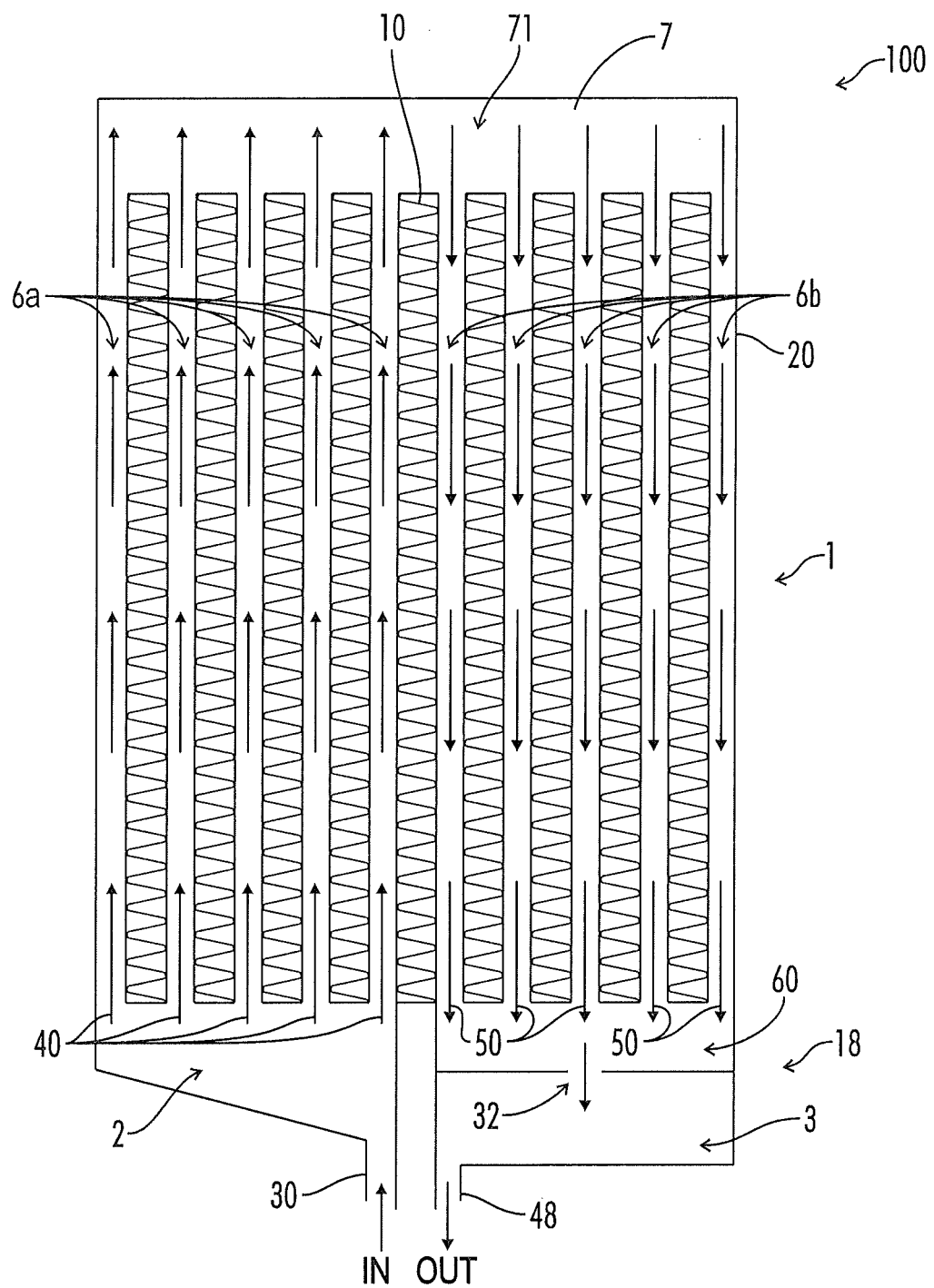
FIG. 9 illustrates a schematic cross-sectional view of an exemplary embodiment of an integrated cooling system in accordance with the present invention.

As seen in FIG. 4 and FIG. 9, in some embodiments, each first longitudinal tube 6a includes a first flow direction 40, and each second longitudinal tube 6b includes a second flow direction 50. The flow directions 40 and 50 generally indicate the direction that a liquid coolant will travel through each respective tube. For example, in some embodiments, liquid coolant travelling through one or more first longitudinal tubes 6a will travel away from the inlet port 30 positioned on the bottom end 24 of radiator 1. Also, liquid coolant travelling through one or more second longitudinal tubes 6b will travel generally toward flow outlet 48, also positioned on the bottom end 24 of radiator 1. Thus, in some embodiments, the first and second flow directions 40, 50 are substantially opposite.

Referring again to FIGS. 1-3, radiator 1 includes a flow inlet 30 and a flow outlet 48. Flow inlet 30 is generally defined as an orifice through which a gas or a fluid can pass to enter apparatus 100. Similarly, flow outlet 48 is generally defined as an orifice through which a gas or a fluid can pass to exit apparatus 100. As seen in FIG. 1, an inlet fitting 37 can be coupled to flow inlet 30, and an outlet fitting 38 can be coupled to flow outlet 48. In some embodiments, inlet fitting 37 and outlet fitting 38 each include a barbed hose connector with a threaded stem, and each fitting 37, 38 threadedly engages its corresponding orifice 30, 48, respectively. During use, an inlet hose or conduit can be secured to inlet fitting 37 for delivering fluid into the cooling system 100, and an outlet hose or conduit can be secured to outlet fitting 38 for delivering fluid from the heat exchanger to the cooling block or heat exchanger engaging the component to be cooled in thermal contact.

In some embodiments, radiator housing 20 includes a first, or upper end 22, and a second, or lower end 24. In some embodiments, the flow inlet 30 and the flow outlet 48 are both positioned on the same end of heat exchanger body 20. As seen in FIG. 1, in one embodiment, flow inlet 30 and flow outlet 48 are both positioned on the lower end 24 of heat exchanger body 20. As such, liquid coolant entering flow inlet 30 passes generally up through heat exchanger body 20 toward upper end 22 and subsequently changes directions in plenum 7 before passing back down toward lower end 24 to exit through flow outlet 48. In embodiments where flow inlet 30 and flow outlet 48 are positioned on the same end of cooling apparatus 100, management of fluid hoses is improved over conventional designs as inlet and exit hoses are positioned spatially near each other.

Liquid coolant is forced through integrated cooling system 100 by a mechanical pump 18 attached to radiator 1. Pump 18 includes a pump housing 19. The pump housing 19 in some embodiments includes an upper pump housing member 12 and a lower pump housing member 42. The lower pump housing member 42 can be detachably securable to upper pump housing member 12. For example, in some embodiments, one or more pump housing fasteners 54 can be used to detachably secure lower pump housing member 42 to upper pump housing member 12. Each pump housing fastener 54 in some embodiments include a socket head cap screw. Additionally, an O-ring can be positioned between upper and lower pump housing members 12, 42 for providing a watertight seal between upper and lower pump housing members 12, 42.

Figure 5:
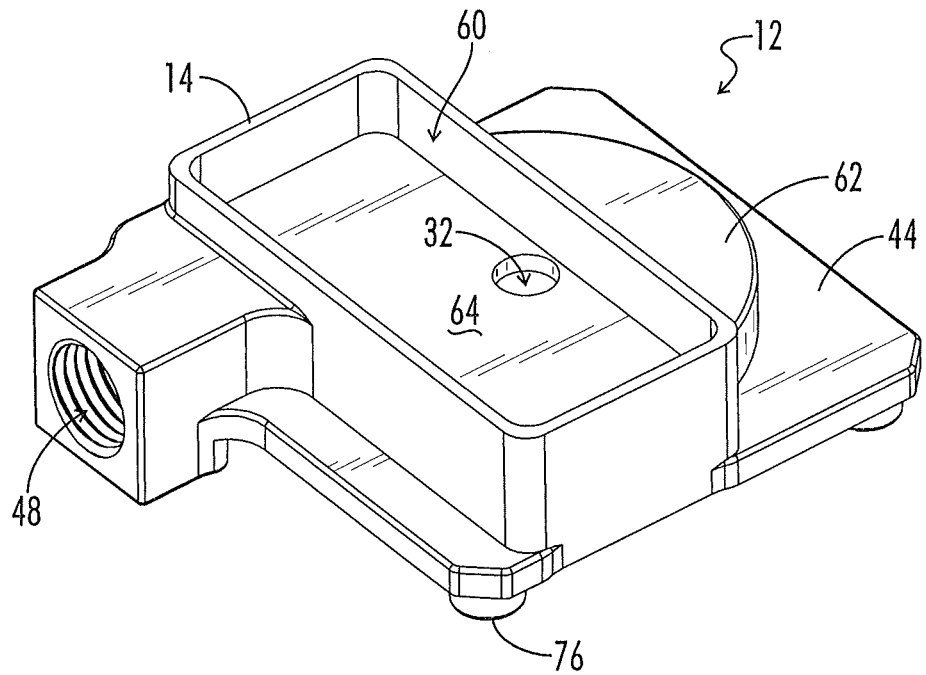
FIG. 5 illustrates a top perspective view of an embodiment of an upper pump housing member of an integrated cooling apparatus in accordance with the present invention.
Figure 6:
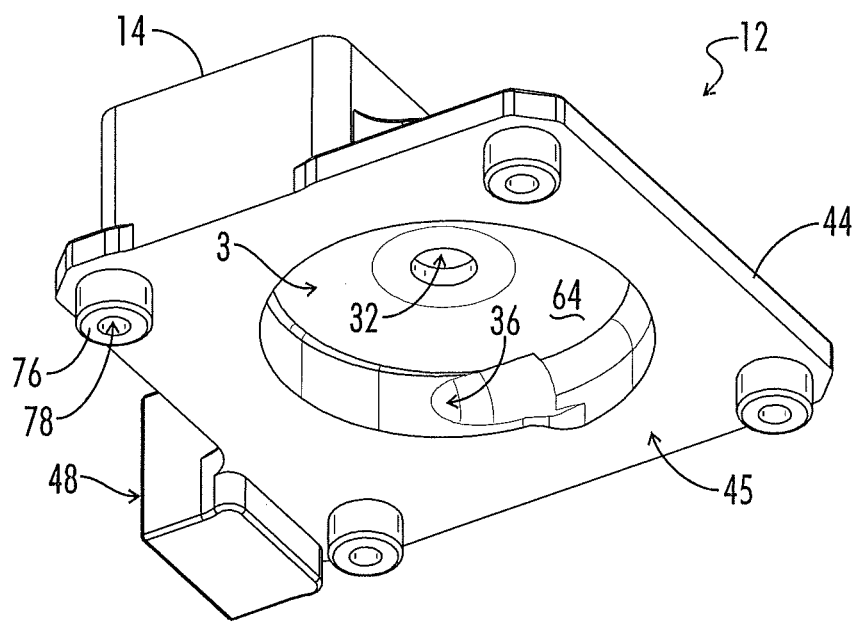
FIG. 6 illustrates a bottom perspective view of the embodiment of an upper pump housing member of FIG. 5.

Referring to FIG. 5 and FIG. 6, an exemplary embodiment of an upper pump housing member 12 is generally illustrated. Upper pump housing member 12 can be integrally formed on radiator 1 including radiator housing 20. Upper pump housing member 12 in other embodiments can be formed separately using a forging, casting, machining, molding or another suitable manufacturing technique and can be subsequently attached to radiator 1. Upper pump housing member 12 can include a metal, plastic, ceramic or other suitable rigid material. Preferably, upper pump housing member 12 includes a nonreactive and noncorrosive material that will not chemically react or corrode when exposed to a liquid coolant such as water or ethylene glycol. Upper pump housing member 12 includes a housing wall 14 that extends generally upward from top 62 of upper pump housing member 12. Housing wall 14 defines a collection reservoir 60 that is positioned on radiator 1 to receive liquid coolant exiting one or more of the plurality of second longitudinal tubes 6b. Housing wall 14 can be integrally formed on radiator 1 or can be attached to radiator 1 using a weld or using another suitable mechanical fastening means. Upper pump housing member 12 also includes a lateral plate 44 extending substantially horizontally from upper pump housing member 12. Plate 44 generally includes a bottom plate surface 45 shaped for engaging lower pump housing member 42. Plate 44 can include a plurality of pilot studs 76 protruding downward from plate 44. Each pilot stud 76 is positioned to engage a corresponding pilot hole 74 defined in lower pump housing member 42, seen in FIG. 2. In some embodiments, one or more pilot studs 76 can define a stud passage 78. Each stud passage 78 can be shaped to receive a pump housing fastener 54. In some embodiments, each stud passage 78 includes a threaded region for threadedly engaging a corresponding threaded region on a pump housing fastener 54. Also seen in FIG. 5, upper pump housing member 12 in some embodiments includes outlet port 48. Outlet port 48 is generally not open to collection reservoir 60 on upper pump housing member 12. Instead, in some embodiments, outlet port 48 is open to an outlet chamber 3 positioned below collection reservoir 60, seen in FIG. 6, via centrifugal exit port 36. In some embodiments, outlet chamber 3 includes a circular shape for allowing a pump impeller, or rotor 46, to rotate inside outlet chamber 3. Centrifugal exit port 36 is aligned substantially tangential to the circular profile of outlet chamber 3 in some embodiments to provide flow of liquid coolant from outlet chamber 3 as pump rotor 46 rotates.

A reservoir wall 64 spans the bottom of collection reservoir 60 and separates collection reservoir 60 from outlet chamber 3, as seen in FIGS. 4-6. Reservoir wall 64 includes an internal exit port 32 that defines a passage for liquid coolant to travel between collection reservoir 60 and second chamber 3, allowing liquid coolant to be engaged by pump rotor 46 and moved out of the pump housing 19 through both centrifugal exit port 36 and outlet port 48. As pump rotor 46 spins and forces liquid coolant through outlet port 48, a negative pressure is created in outlet chamber 3 that pulls additional liquid coolant through exit port 36 from collection reservoir 60. Collection reservoir 60 receives liquid coolant from one or more second longitudinal tubes 6b and generally maintains a fluid volume of liquid coolant housed in collection reservoir 60 during use.

Referring again to FIG. 1 and FIG. 2, in some embodiments, pump rotor 46 is generally included in the pump housing 19 between upper pump housing member 12 and lower pump housing member 42. Pump rotor 46 generally defines a rotor axis of rotation 56 about which pump rotor 46 rotates during use. In some embodiments, rotor axis of rotation 56 is substantially parallel to the second flow direction 50 of liquid coolant passing through one or more second longitudinal tubes 6b, seen in FIG. 4 and FIG. 9. In such embodiments, liquid coolant can be ejected from cooling apparatus 100 along flow exit axis 58. Additionally, liquid coolant can be received into cooling apparatus 100 along flow entrance axis 57. In some embodiments, flow exit axis 58 is substantially perpendicular to the rotor axis of rotation 56. Additionally, in some embodiments, flow exit axis 58 is substantially perpendicular to second flow direction 50, and flow entrance axis 57 is substantially perpendicular to first flow direction 40.

Also seen in FIGS. 1-4 and FIGS. 7-11, in some embodiments, a plenum 7 is disposed on radiator 1. More particularly, plenum 7 can be positioned on radiator housing 20 and can form a plenum cavity, or a reservoir 71, seen for example in FIG. 8, for storing liquid coolant contained in radiator 1. As seen in FIG. 9, in some embodiments, the first plurality of longitudinal tubes 6a is positioned to deliver liquid coolant into the reservoir defined by plenum 7. Also, the second plurality of longitudinal tubes 6b is positioned to receive liquid coolant from the reservoir defined by plenum 7. Thus, liquid coolant enters plenum 7 from one or more first longitudinal tubes 6a, as indicated by arrows 40, and exits plenum 7 through one or more second longitudinal tubes 6b, as indicated by arrows 50.

Figure 10:
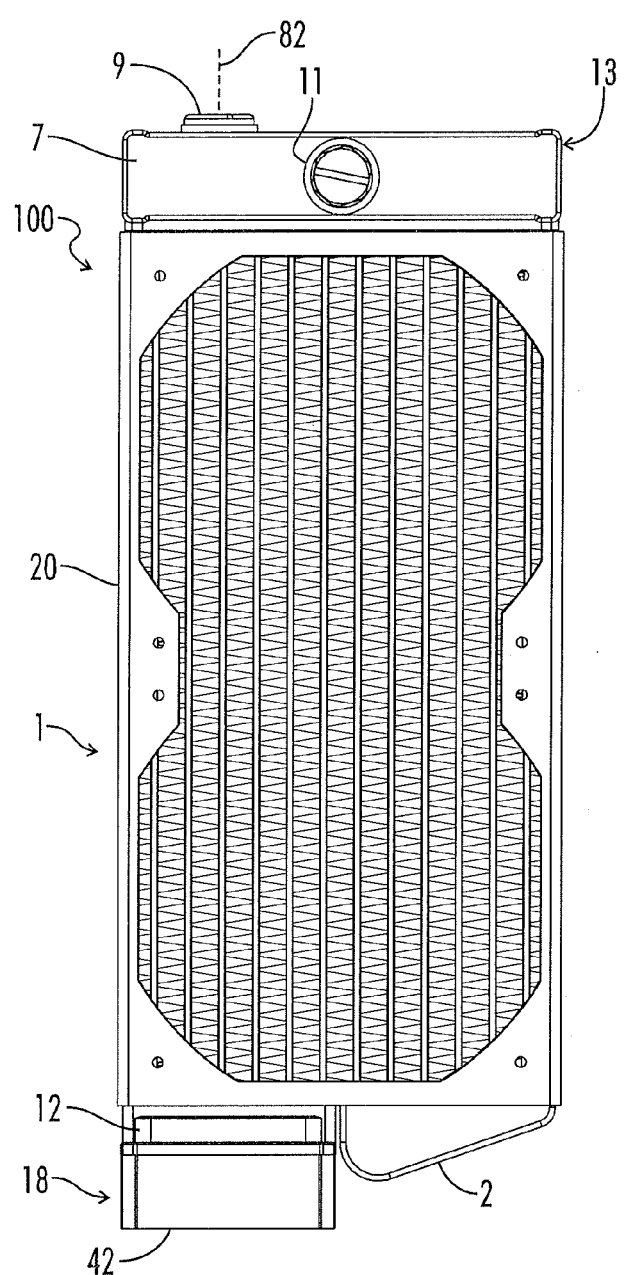
FIG. 10 illustrates a back elevation view of an embodiment of an integrated cooling apparatus having an extended plenum section in accordance with the present invention.
Figure 11:
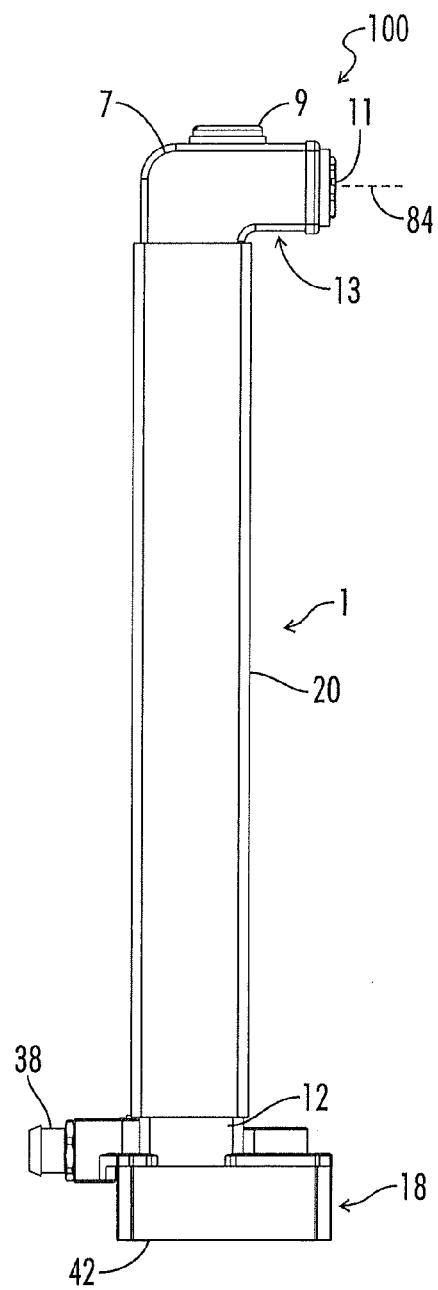
FIG. 11 illustrates a side elevation view of the embodiment of an integrated cooling apparatus of FIG. 10.

Also, as seen in FIG. 1 and FIG. 2, in some embodiments, a fill cap 9 is removably disposed in a fill cap socket 8. Fill cap socket 8 is defined in plenum 7. Fill cap socket 8 can be defined in the top end 22 of cooling apparatus 100. Fill cap 9 can be selectively removed from fill cap socket 8 for adding liquid coolant to, or for removing liquid coolant from, reservoir 1. Referring now to FIG. 10 and FIG. 11, in some embodiments, plenum 7 can include an extended plenum region 13 extending horizontally from plenum 7. Extended plenum region 13 in some embodiments extends substantially perpendicular to first and second flow directions 40, 50. Extended plenum region 13 in some embodiments defines a second fill cap socket. An auxiliary fill cap 11 can be selectively disposed in the second fill cap socket. As such, plenum 7 includes two sockets through which liquid coolant can be added to or removed from radiator 1. Also, as seen in FIG. 10 and FIG. 11, first fill cap 9 is generally rotated about a first fill cap axis 82, and second fill cap 11 is generally rotated about a second fill cap axis 84. In some embodiments, first and second fill cap axes 82, 84 are not parallel. In additional embodiments, first and second fill cap axes 82, 84 are substantially perpendicular.

Referring again to FIG. 1, in some embodiments, an inlet chamber 2 is defined in cooling apparatus 100 between flow inlet 30 and one or more of first longitudinal tubes 6a. Inlet chamber can include a cavity defined on the interior of radiator 1 positioned for receiving a volume of liquid coolant after the liquid coolant enters inlet port 30. During use, the liquid coolant enters inlet chamber 2 and passes through inlet chamber 2 before entering one or more of first longitudinal tubes 6a.

Figures 7, 8:
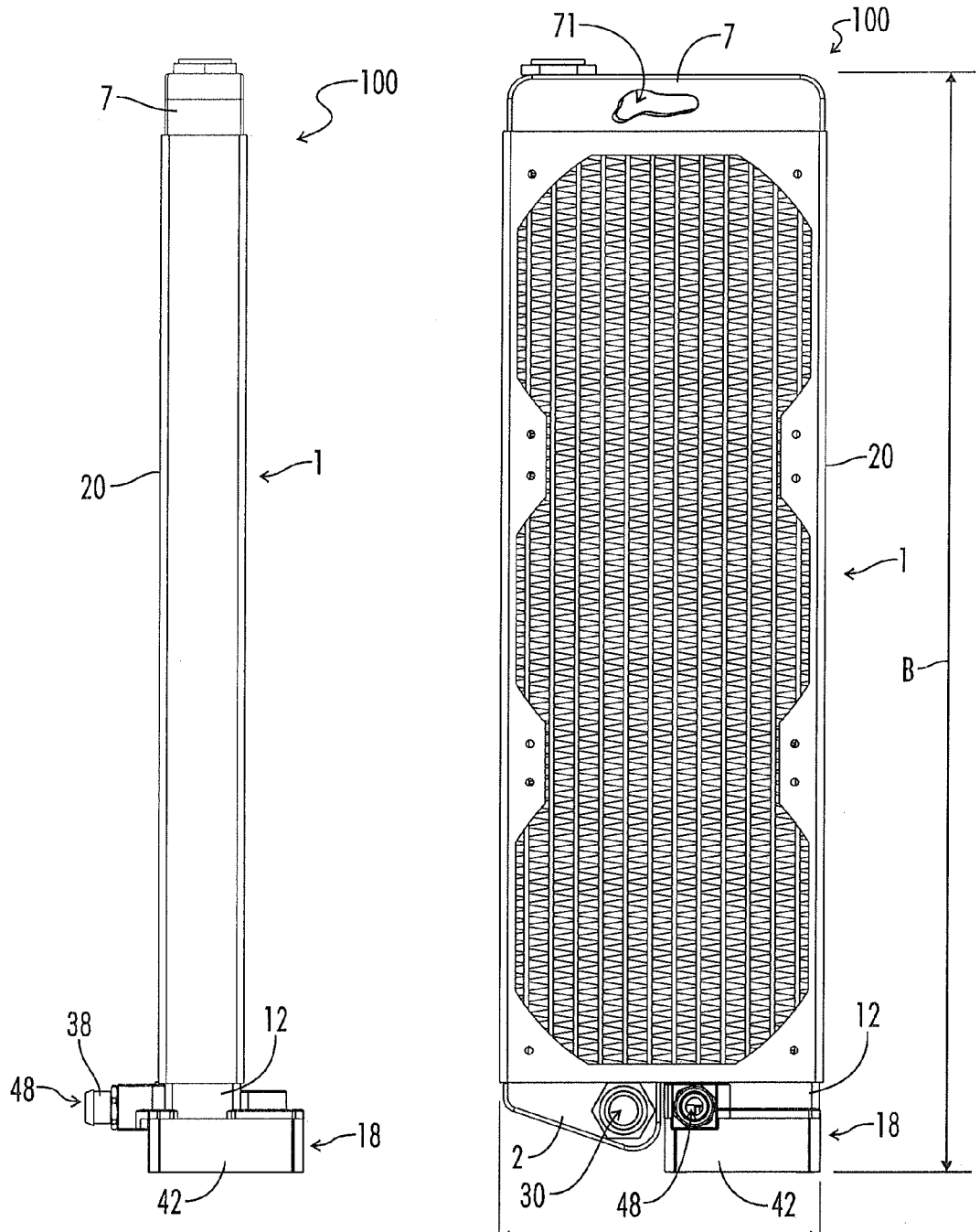
FIG. 7 illustrates a side view of an embodiment of an integrated cooling apparatus in accordance with the present invention.
FIG. 8 illustrates a front elevation view of the embodiment of an integrated cooling apparatus of FIG. 7.

Referring now to FIG. 8, in some embodiments, a cooling apparatus 100 includes a radiator 1 with integrated pump 18 having a width A and a height B. In some embodiments, B is greater than A so that the heat transfer performance characteristics of radiator 1 are achieved while simultaneously allowing cooling apparatus 100 to be mounted on a computer chassis or electronic device. In other embodiments, the ratio of A divided by B is between about 0.1 and about 0.9. In further embodiments, desired heat transfer and form factor characteristics are achieved by providing a ratio of A divided by B between about 0.2 and about 0.4.

A further embodiment of the present invention provides a method of cooling an electronic device, including the steps of: (a) providing an active cooling system having a radiator and an integrated pump attached to the radiator; (b) passing heated liquid into the radiator through a flow inlet; (c) forcing the liquid through a first longitudinal tube in a first flow direction away from the flow inlet; (d) passing the liquid through a plenum disposed on the end of the radiator opposite the flow inlet; (e) forcing the liquid through a second longitudinal tube in a second flow direction opposite the first flow direction; (f) collecting the liquid in a collection reservoir interior to the radiator; (g) passing the liquid through an exit port in the collection reservoir to an outlet chamber; (h) ejecting the liquid from the outlet chamber using a mechanical pump.

Figure 12:
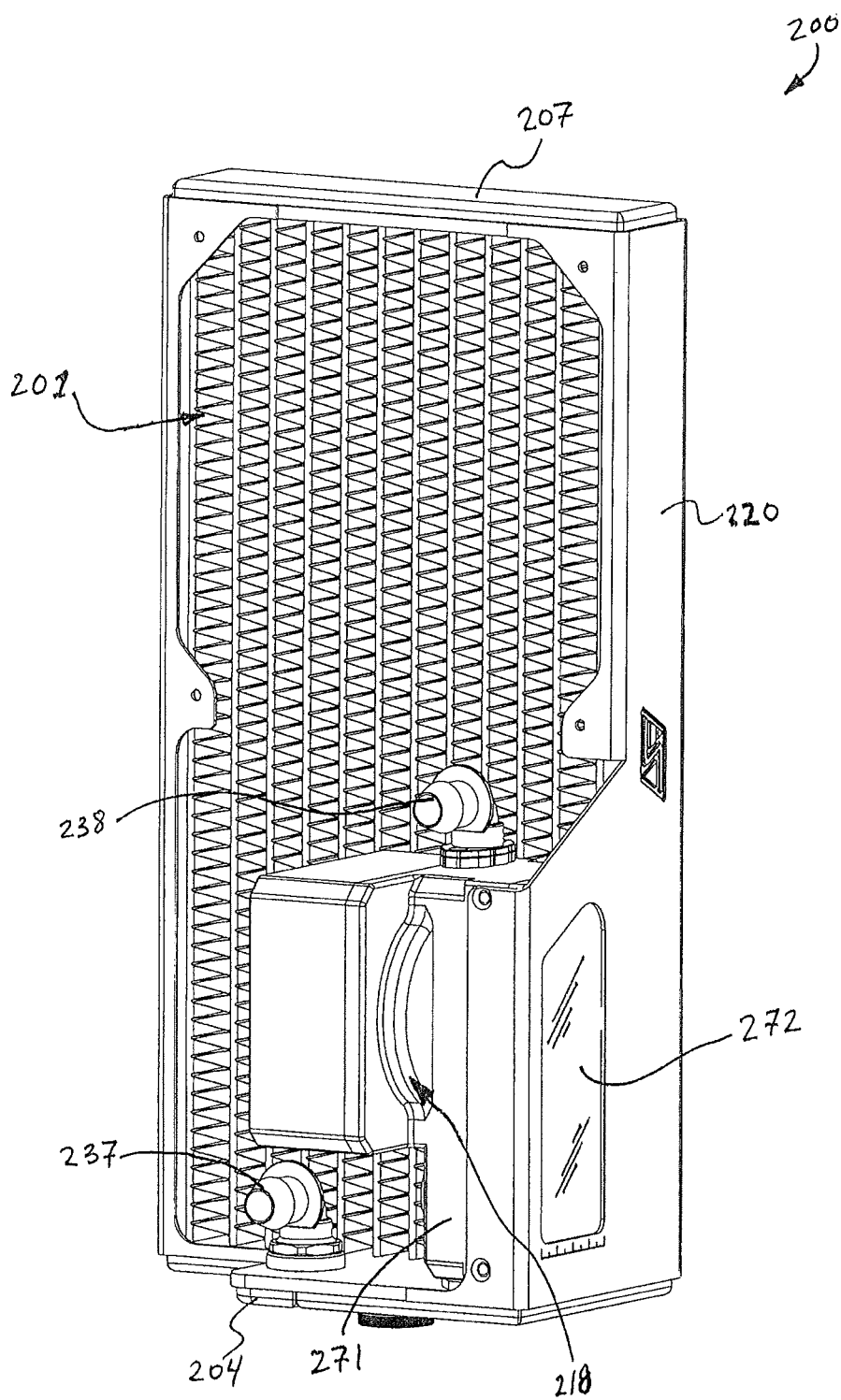
FIG. 12 illustrates a perspective view of an alternative embodiment of an integrated cooling apparatus.
Figure 13:
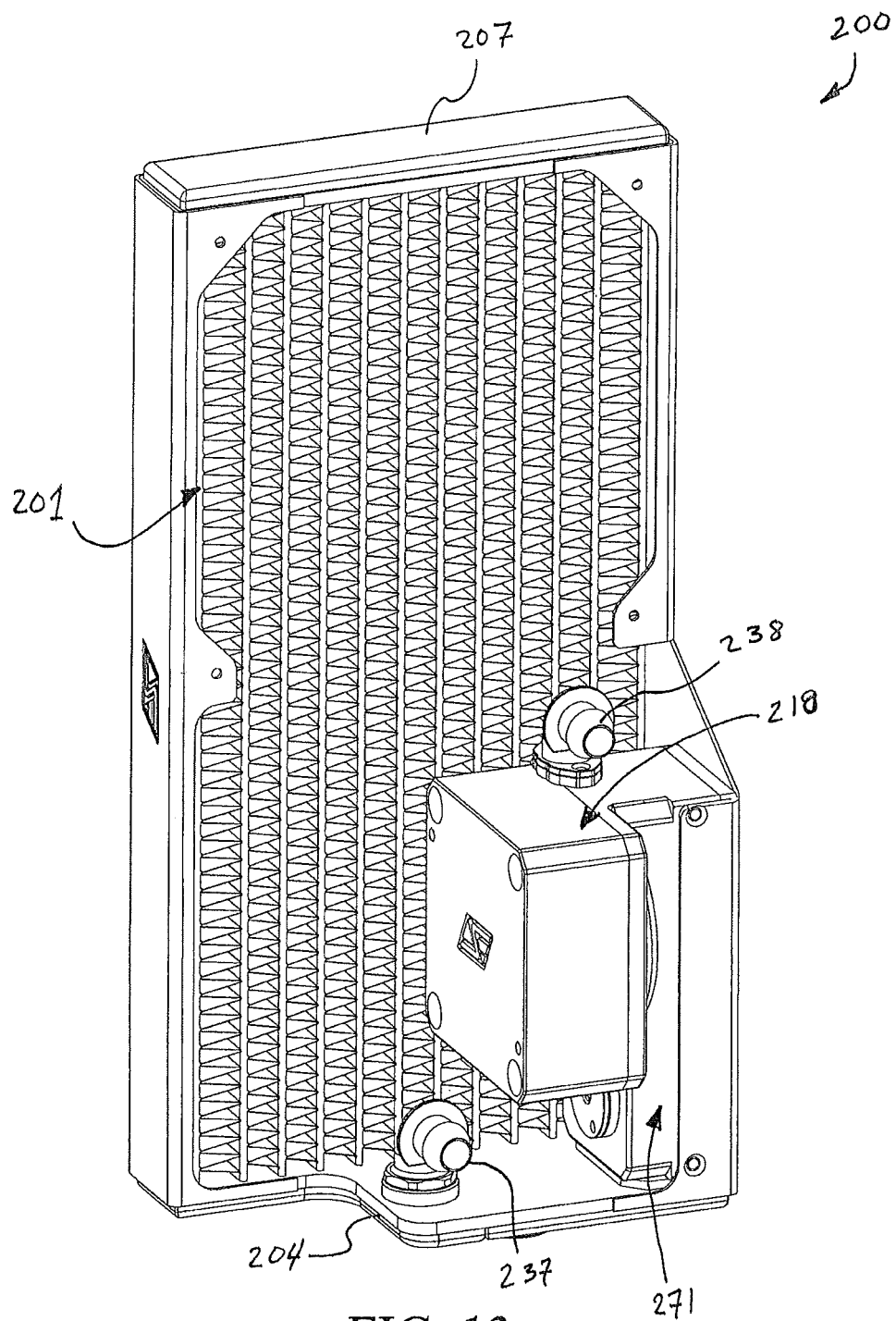
FIG. 13 illustrates a perspective view of the alternative embodiment of an integrated cooling apparatus of FIG. 12.
Figure 19:
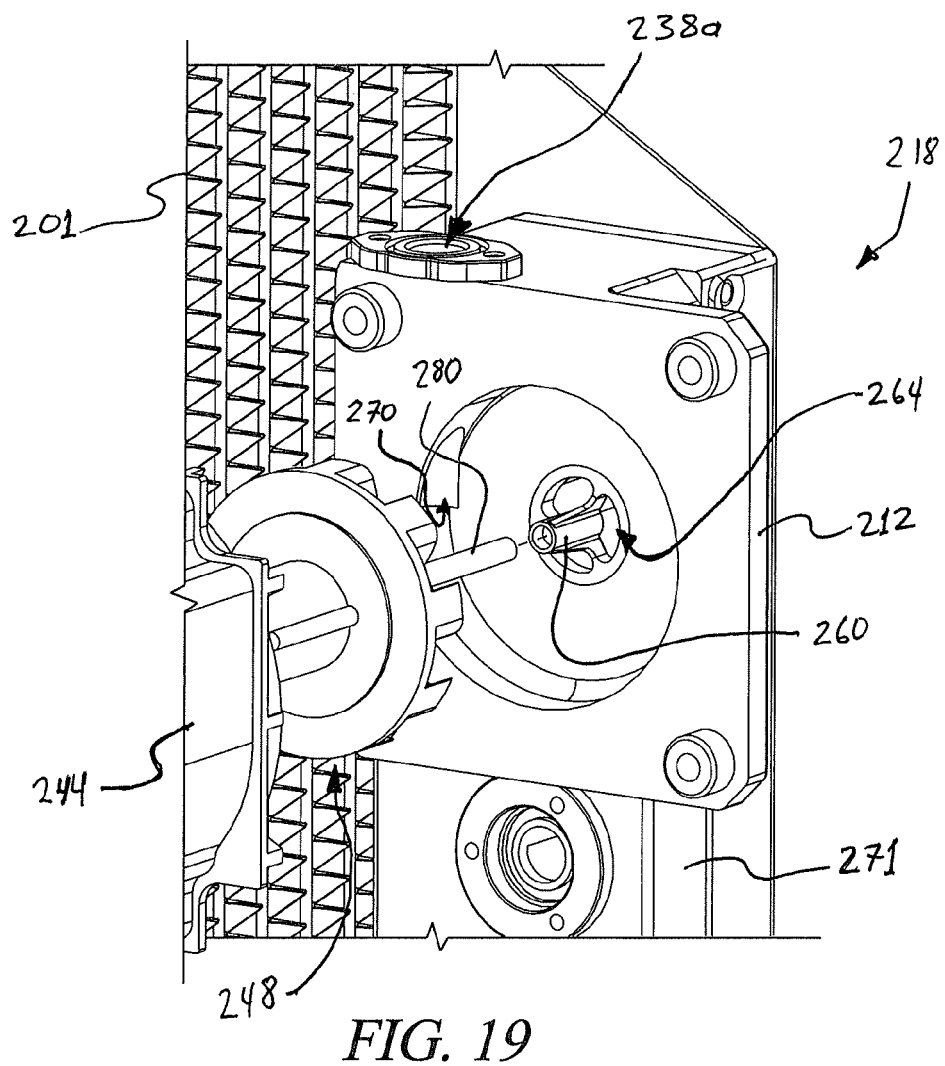
FIG. 19 illustrates a partially exploded perspective view of an embodiment of a pump of an integrated cooling apparatus of FIG. 17.

Referring now to FIG. 12, an additional embodiment of a cooling apparatus 200 is shown having an alternative pump mounting location. As seen in FIG. 12, a cooling apparatus 200, or integrated radiator and pump apparatus, includes a radiator 201 coupled to a pump 218. Pump 218 is mounted on radiator 201 using one or more mechanical fasteners or other suitable mechanical attachments. By mounting pump 218 on radiator 201, as seen in FIGS. 12-15 and 17-19, it is possible to reduce the need for cumbersome flexible tubing or hose between the pump 218 and the radiator 201. Pump 218 is said to be mounted on radiator 201 where pump 218 is mechanically fixed to radiator 201 either directly or indirectly through additional structural features such as reservoir 271. For example, as seen in FIG. 13, in some embodiments, a reservoir 271 is installed on radiator 201, and pump 218 is installed on reservoir 271. In such embodiments, pump 218 may be said to be mounted on radiator 201 where pump 218 is mechanically attached to radiator 201 via reservoir 271 or via other mechanical structure. Additionally, reservoir 271 is integrally attached to pump 218 in some embodiments, as seen in FIG. 19. Reservoir 271 is positioned in a fluid circuit between pump 218 and first plenum 204 in some embodiments.

Figure 15:
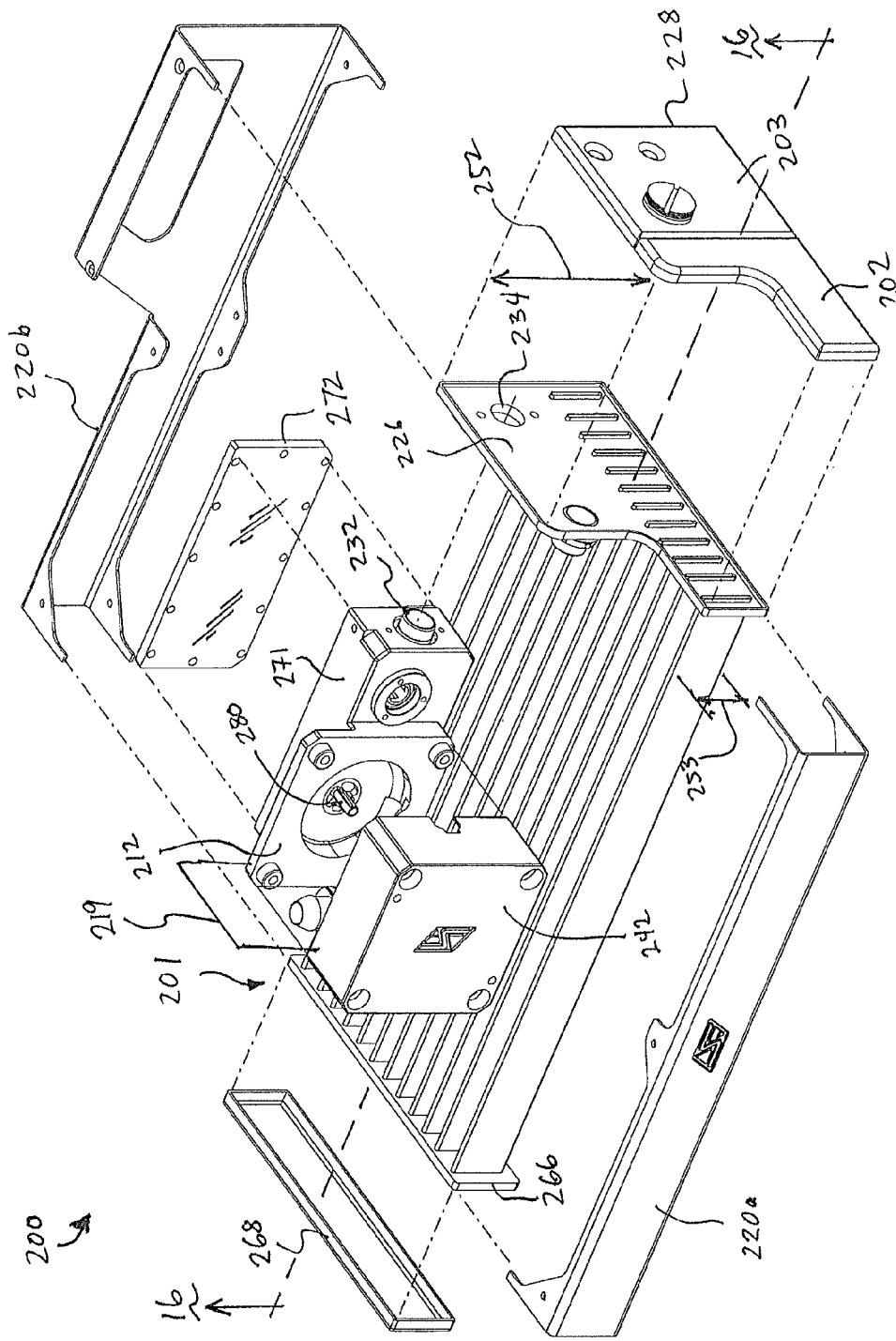
FIG. 15 illustrates a partially exploded perspective view of the alternative embodiment of an integrated cooling apparatus of FIG. 12.

Referring further to FIG. 15, in some embodiments, pump 218 includes a pump housing 219. Pump housing 219 includes a first pump housing member 212 and a second pump housing member 242. First and second pump housing members 212, 242 define an interior pump space shaped to house pump machinery such as a pump rotor or pump impeller in some embodiments. First and second pump housing members 212, 242 may be detachably securable to one another in some embodiments. First pump housing member 212 may be integrally formed as part of reservoir 271 in some embodiments. For example, first pump housing member 212 and a portion of reservoir 271 may be formed in a single molding procedure such as by injection molding or casting. As such, pump 218 includes an integral reservoir. In alternative embodiments, first pump housing member 212 is integrally formed on radiator 201 or first plenum 204. Pump 218 includes any suitable conventional pump for forcing liquid coolant through radiator 201, such as a rotary, impeller, peristaltic, or in-line mechanical pump.

Referring further to FIG. 15 and FIGS. 17-19, pump housing 219 in some embodiments houses a pump rotor, or pump impeller 248. An inner pump housing 244 is positioned between first pump housing member 212 and second pump housing member 242. Inner pump housing 244 provides an impeller socket 256 shaped to receive impeller 248. A portion of impeller 248 such as impeller base 250 may rotate freely in impeller socket 256. A shaft 280 extends between a first shaft support 258 on inner pump housing 244 and a second shaft support 260 on first pump housing member 212. Impeller 248 is rotatable about shaft 280 during use. Shaft 280 may be fixed in place relative to first and second pump housing members 212, 242 in some embodiments. Alternatively, shaft 280 may rotate. Inner pump housing 244 is sealed to first pump housing member 212 using a perimeter seal 246 such as an O-ring or sealing adhesive. During use, impeller 248 spins about shaft 280, causing impeller blades 254 to force coolant through the closed loop system. Impeller 248 includes an impeller base 250 that is seated in impeller socket 256. Impeller 248 includes one or more magnets that may be used to impart rotation on impeller 248 via associated stator, windings, circuitry, and electronic controls located on inner pump housing 244. By controlling the electrical current passing through the stator in inner pump housing 244, the rotational speed of impeller 248, and thus the flowrate of liquid coolant, may be controlled.

Referring further to FIG. 19, liquid coolant may travel between reservoir 271 and the interior of pump housing 219 via one or more pump ports 264 defined in first pump housing member 212. In some embodiments, pump ports 264 are defined near second shaft support 260. Liquid coolant may be drawn axially into pump housing 219 toward impeller 248, and particularly into the space between inner pump housing 244 and first pump housing member 212 axially onto impeller 248. The coolant then may be driven radially away from shaft 280 due to the spinning motion of impeller 248. A centrifugal exit port 270 is defined along the outer perimeter of first pump housing member 212 in some embodiments. Centrifugal exit port 270 is in fluid communication with outlet fitting orifice 238*a* in some embodiments. Outlet fitting 238 generally attaches to outlet fitting orifice 238*a*. Liquid coolant may exit pump housing 219 via centrifugal exit port 270 during use. Pump parts housed within pump housing 219 that may contact liquid coolant and are generally made of a non-corrosive material such as a polymer or plastic in some embodiments. Pump 218 may be configured to operate using AC or DC electrical current.

A first fluid fitting 237 is installed on radiator 201, and a second fluid fitting 238 is installed on the integrated pump and reservoir 218, 271 in some embodiments. First fluid fitting 237 provides a flow inlet to allow liquid coolant to enter the cooling apparatus 200. Second fluid fitting 238 provides a flow outlet in some embodiments and allows liquid coolant to leave the cooling apparatus 200. In alternative embodiments, second fluid fitting 238 may be installed at other suitable locations such as but not limited to on pump 218, on second pump housing 242, or on reservoir 271. Second fluid fitting 238 is an outlet fitting in some applications, and pump 218 is operable to force liquid from radiator 201 to a cooling block or other heat exchanger apparatus remote from radiator 201 through second fluid fitting 238. First and second fluid fittings 237, 238 in some embodiments include a hose connector fitting or a quick release fluid connector.

Reservoir 271 provides a chamber for storing liquid coolant. A volume of liquid coolant may be retained in reservoir 271 during use of the cooling apparatus. A reservoir window 272 is positioned on a side of the cooling apparatus 200. Reservoir window 272 includes a transparent material in some embodiments and allows a user to visually observe an amount of liquid in the closed-loop cooling system. If the volume of coolant as indicated through the window is not sufficient, a user will know to add coolant. In some applications, the cooling apparatus 200 is positioned in or near a computer device such that the side of radiator 200 having reservoir 271 is oriented downwardly. As such, the major plane of the radiator 201 may be positioned in a horizontal plane. In alternative embodiments, cooling apparatus 200 may be positioned such that the major plane of the radiator 201 is vertical or angled.

Referring further to FIGS. 12-16, a first plenum 204 is positioned at a first longitudinal end of radiator 201. First plenum 204 includes a hollow interior region allowing the passage of liquid coolant between longitudinal radiator tubes 206. First plenum 204 includes a first plenum board 226, or first plenum base, and a first plenum cap 228. The first plenum board 226 and the first plenum cap 228 together define an interior space of first plenum 204. A water-tight seal is provided between first plenum board 226 and first plenum cap 228. First plenum board 226 may be welded or glued onto first plenum cap 228 in some embodiments. First plenum board 226 is coupled to the ends of the longitudinal radiator tubes in a sealed or watertight arrangement. Each longitudinal tube is open to the first plenum 204. The longitudinal tubes 206 include radiator tubes on radiator 201 for providing heat exchange between the liquid coolant passing through the tubes and the ambient atmosphere or a forced air stream passing between the tubes. A plurality of heat exchanger fins extends between adjacent longitudinal tubes to facilitate heat transfer to the surroundings.

Figure 14:
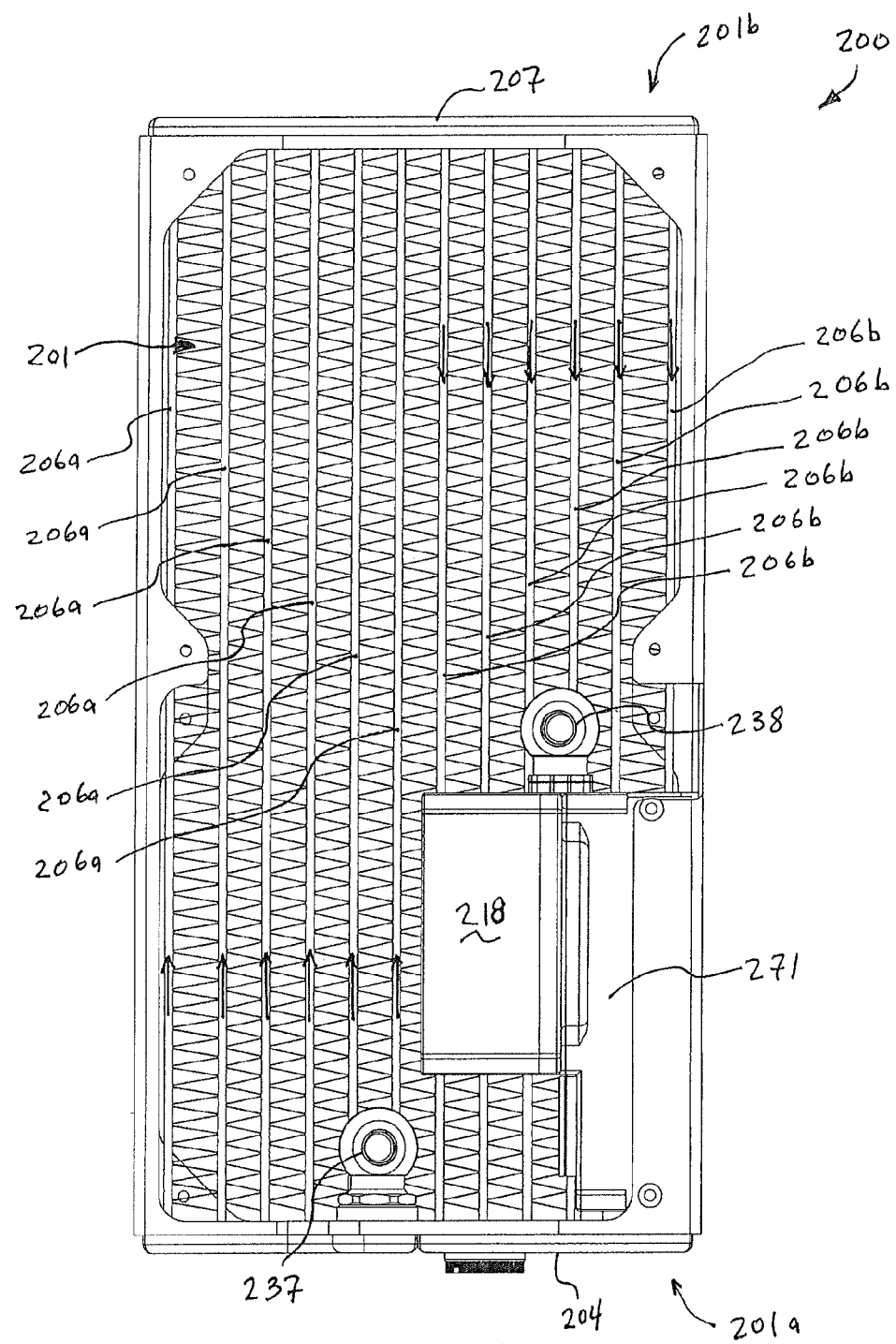
FIG. 14 illustrates a front elevation view of the alternative embodiment of an integrated cooling apparatus of FIG. 12.
Figure 16:
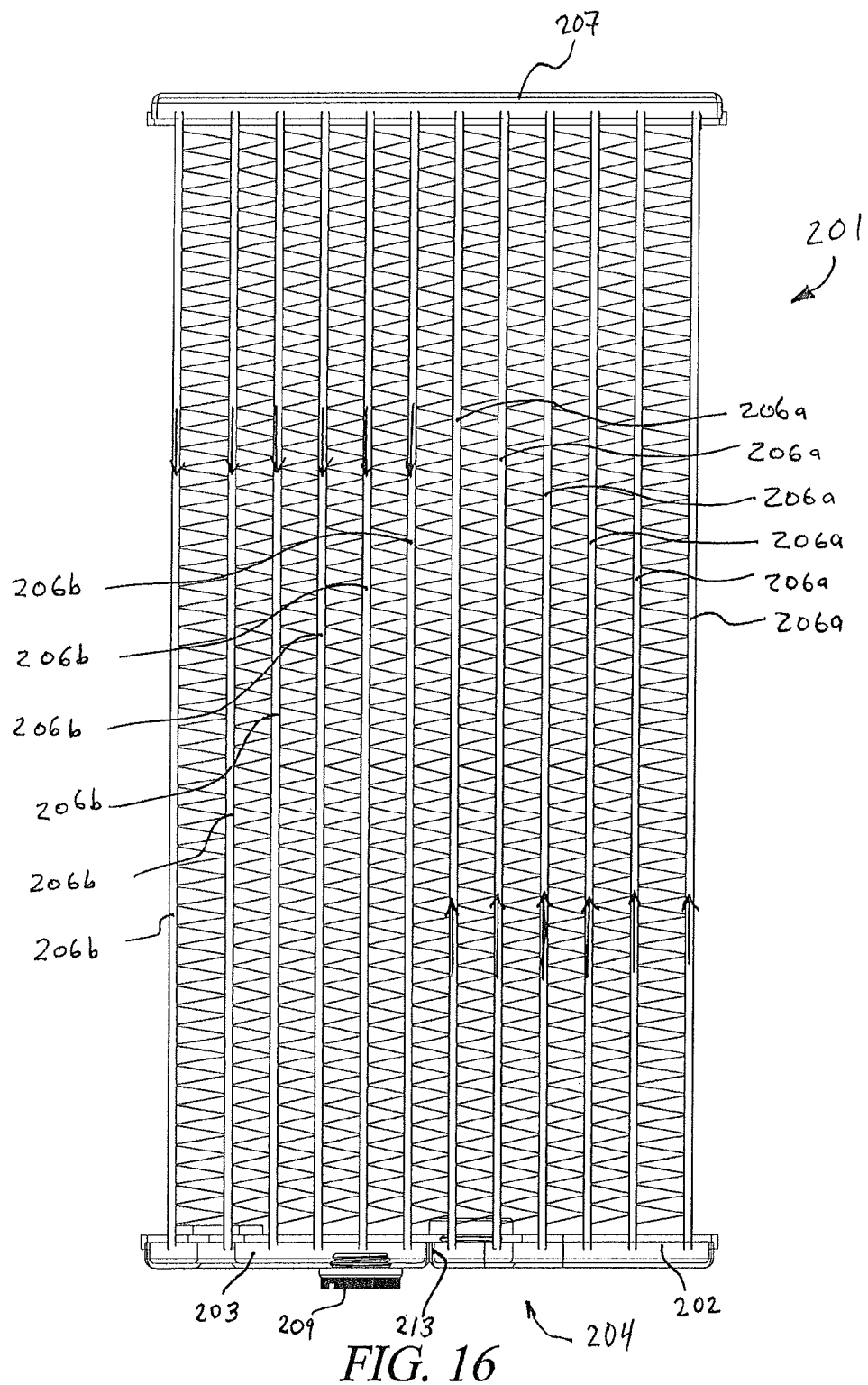
FIG. 16 illustrates a partial cross-sectional view of Section 16-16 from FIG. 15.
Figure 17:
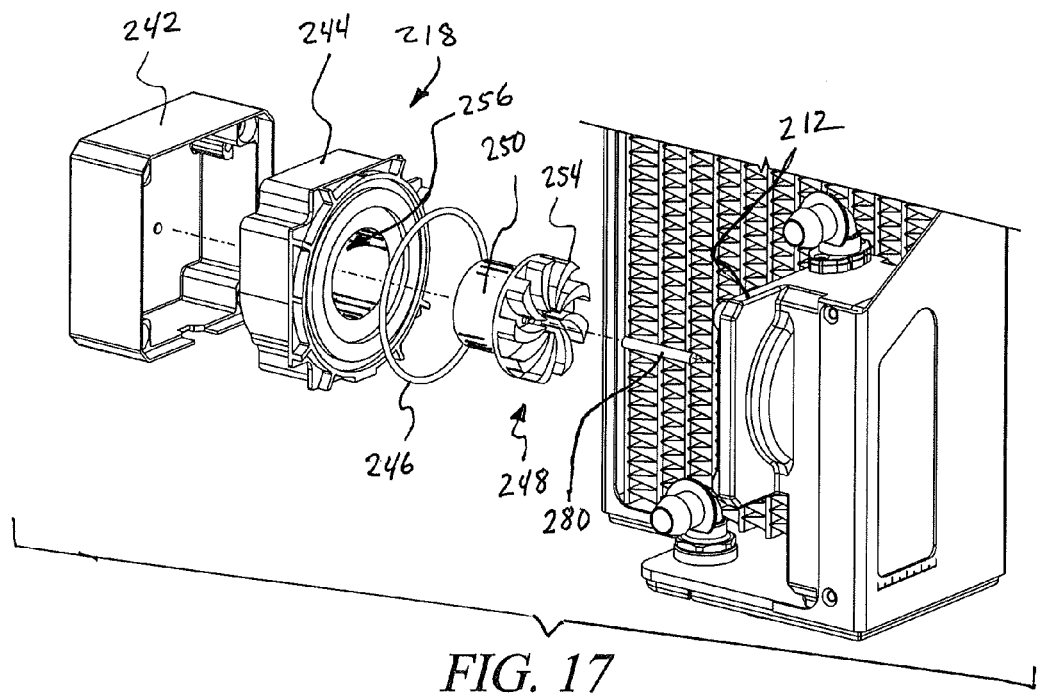
FIG. 17 illustrates a partially exploded perspective view of an embodiment of a pump of an integrated cooling apparatus.
Figure 18:
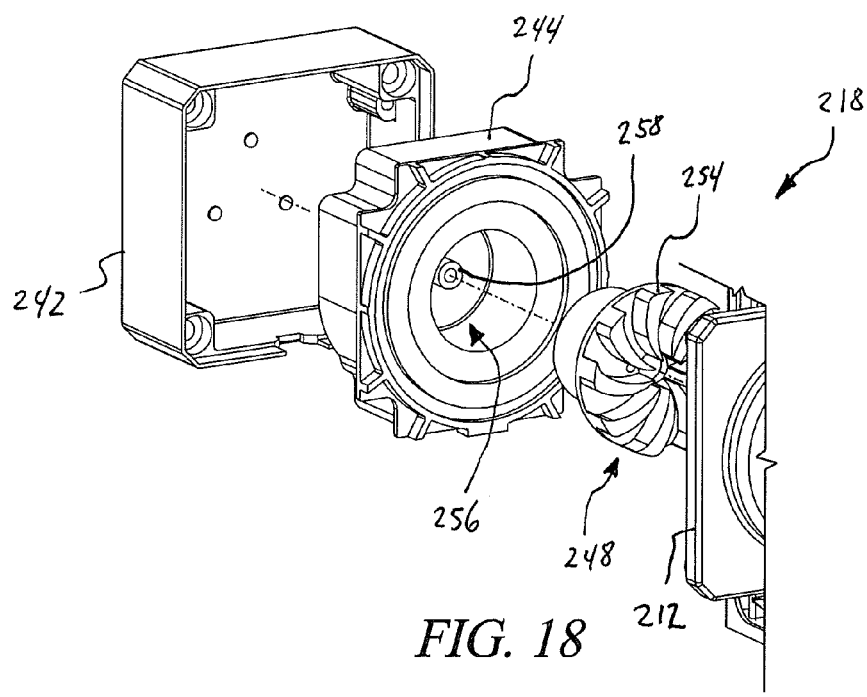
FIG. 18 illustrates a partially exploded perspective view of the embodiment of a pump of an integrated cooling apparatus of FIG. 17.

Radiator 201 includes one or more inlet tubes 206*a* and one or more outlet tubes 206*b*, seen in FIGS. 14 and 16. Each inlet tube 206*a* carries liquid coolant away from first plenum 204 toward a second plenum 207 located at the opposite longitudinal end of radiator 201. Each outlet tube 206*b* carries liquid coolant away from second plenum 207 back toward first plenum 204, as shown by the arrows in FIG. 14 and FIG. 16.

Second plenum 207 includes a second plenum board 266, or second plenum base, and a second plenum cap 268 in some embodiments. The space between second plenum board 266 and second plenum cap 268 provides the hollow interior of second plenum 207. Second plenum board 266 and second plenum cap 268 are connected in a water-tight seal and may be secured together by welding or an adhesive in some embodiments. Liquid travelling through each inlet tube 206*a* is ejected into second plenum 207 before being channeled into outlet tubes 206*b*. Second plenum 207 in some embodiments does not include any plumbing or liquid connectors, and merely serves as a plenum for allowing liquid coolant to reverse direction and travel back toward first plenum 204. Alternatively, one or more liquid fittings may be disposed on second plenum 207. Second plenum board 266 may be rigidly attached to the longitudinal ends of inlet and outlet tubes 206a, 206b such that a watertight seal is formed between the tube ends and the second plenum board 266, and such that the tubes are open to the interior of second plenum 207.

Referring further to FIG. 16, a plenum wall 213 is positioned in first plenum 204, dividing first plenum 204 into an input chamber 202 and a separate output chamber 203. Input and output chambers of first plenum 204 are not fluidly open directly to each other in some embodiments. Rather, for fluid to pass from inlet chamber 202 to outlet chamber 203, the liquid must travel through inlet tubes 206a, into second plenum 207, and back through outlet tubes 206b. One or more input tubes 206a are open to input chamber 202, and one or more output tubes 206b are open to output chamber 203. During use, liquid coolant enters the cooling apparatus 200 through input fitting 237. The coolant then enters input chamber 202 in first plenum 204. The coolant then travels through input tubes 206a into second plenum 207. The coolant then travels through second plenum 207 and into one or more output tubes 206b toward first plenum 204. The coolant then passes into the output chamber 203 on first plenum 204 and into the reservoir 271 via first plenum board outlet hole 234, seen in FIG. 15. The coolant passes into reservoir 271 via reservoir port 232 which is open to and in fluid communication with outlet chamber 203 on first plenum 204. Pump 218 may draw the liquid through reservoir 271 into the space between inner pump housing 244 and first housing member 212 and out outlet fitting 238. The liquid leaving outlet fitting 238 is carried to a remote heat exchanger at a desired heat extraction location on a circuit board component. Upon leaving the remote heat exchanger, the liquid travels in a closed loop and re-enters the radiator apparatus 200 via input fitting 237. First pump housing member 212 is in fluid communication with longitudinal tubes 206 as fluid may travel through the tubes and into first pump housing member via pump port 264.

As seen in FIG. 15, a frame 220 supports the radiator 201 and reservoir 271. Frame 220 includes a first frame member 220a and a second frame member 220b in some embodiments. In other embodiments, a single frame member, or more than two frame members may be used. FIG. 16 shows an embodiment of a radiator 201 that may be positioned in frame 220.

As seen in FIG. 15, in some embodiments, first plenum board 226 includes a first plenum board height 252 greater than radiator height 253. This allows the pump 218 and reservoir 271 to be mounted on a side of radiator 201 as seen in FIGS. 12-14, as opposed to at a longitudinal end of radiator 201 as seen in FIGS. 1-8. By positioning the pump and reservoir hardware on a side of radiator 201, it is possible to maximize the length of tubes 206 for a given footprint. This is particularly important when mounting the cooling apparatus 200 in an enclosure or in a size-constrained environment. In some embodiments, as seen in FIGS. 14 and 15, the pump 218 and reservoir 271 are located on a side of radiator 201 at a longitudinal position entirely between opposite longitudinal ends 201a, 201b of the radiator 201. As such, pump 218 and reservoir 271 are positioned on a side of radiator 201 at a longitudinal position entirely between first plenum 204 and second plenum 207. Also seen in FIG. 16, in some embodiments, a filling plug 209 is positioned on output chamber 203 of first plenum 204. In alternative embodiments, filling plug 209 may be located at other suitable locations such as on the input chamber 202, reservoir 271 or second plenum 207.

Thus, although there have been described particular embodiments of the present invention of a new and useful Radiator with Integrated Pump for Actively Cooling Electronic Devices, it is not intended that such references be construed as limitations upon the scope of the invention except as set forth in the following claims.

What is claimed is:

1. An integrated cooling apparatus for actively cooling one or more computer components using a liquid coolant, comprising:
  a radiator having a first longitudinal tube positioned to receive the liquid coolant;
  a coolant reservoir disposed on the radiator, the coolant reservoir in fluid communication with the radiator;
  a pump mounted on the coolant reservoir, the pump in fluid communication with the coolant reservoir; and
  a flow outlet disposed downstream of the pump and upstream of a heat exchanger,
  wherein the coolant reservoir is positioned between the radiator and the pump, and the coolant reservoir includes a chamber for storing a volume of liquid coolant separate from the pump and separate from the radiator between the pump and the radiator,
  wherein the pump is operable to force the liquid coolant through both the radiator and through the coolant reservoir,
  wherein the coolant reservoir and the pump are positioned on a side of the radiator.

2. The apparatus of claim 1, wherein the apparatus includes a first pump housing member that is integrally formed with the radiator and that defines the coolant reservoir.

3. The apparatus of claim 2, wherein the apparatus includes a second pump housing member disposed on the first pump housing member that houses the pump.

4. The apparatus of claim 1, further comprising a first plenum positioned at a first longitudinal end of the radiator.

5. The apparatus of claim 4, the first plenum comprising:
  a first plenum board attached to a first end of the first longitudinal tube; and
  a first plenum cap disposed on the first plenum board, the first plenum cap forming a cavity between the first plenum board and the first plenum cap.

6. The apparatus of claim 5, wherein the first end of the first longitudinal tube is open to the first plenum.

7. The apparatus of claim 5, further comprising a plenum wall disposed in the first plenum chamber, the plenum wall dividing the first plenum chamber into an inlet chamber and an outlet chamber, the first end of the first longitudinal tube open to the inlet chamber.

8. The apparatus of claim 7, further comprising:
  the radiator including a second longitudinal tube spaced from the first longitudinal tube, a first end of the second longitudinal tube open to the outlet chamber.

9. The apparatus of claim 8, further comprising:
  a second plenum disposed at a second longitudinal end of the radiator opposite the first plenum,
  wherein a second end of the first longitudinal tube is open to the second plenum, and
  wherein a second end of the second longitudinal tube is open to the second plenum.

10. The apparatus of claim 9, further comprising:
  the second plenum including a second plenum board attached to the first and second longitudinal tubes; and the second plenum including a second plenum cap positioned on the second plenum board, the second plenum forming a cavity between the second plenum cap and the second plenum board, wherein the second ends of the first and second longitudinal tubes are open to the second plenum.

11. A heat exchanger apparatus for actively cooling a circuit component in a computer, the apparatus comprising:

a radiator having a radiator height;

a first plurality of longitudinal tubes disposed on the radiator defining a first flow direction;

a second plurality of longitudinal tubes disposed on the radiator defining a second flow direction, wherein the first and second flow directions are substantially opposite;

a first plenum disposed at a first longitudinal end of the radiator, the first plenum including a first plenum board having a first plenum board height that is greater than the radiator height;

a second plenum disposed at a second longitudinal end of the radiator;

a plurality of heat exchanger fins extending between adjacent longitudinal tubes;

a liquid coolant reservoir disposed on the radiator and mounted to the first plenum board; and a pump disposed on the liquid coolant reservoir, the pump and the liquid coolant reservoir being positioned at a longitudinal position entirely between the first plenum and second plenum and on a side of the radiator through which air or another gas can be passed through the radiator, wherein the liquid coolant reservoir is disposed between the radiator and the pump, and wherein the pump is operable to force liquid coolant to travel between the radiator and the pump through the liquid coolant reservoir.

12. The apparatus of claim 11, further comprising a first plenum wall disposed in the first plenum, the first plenum wall dividing the first plenum into an inlet chamber and an outlet chamber.

13. The apparatus of claim 12, wherein the first plurality of longitudinal tubes are open to the inlet chamber at one end and are open to the second plenum at the opposite end.

14. The apparatus of claim 13, wherein the second plurality of longitudinal tubes are open to the outlet chamber at one end and are open to the second plenum at the opposite end.

15. The apparatus of claim 14, wherein the liquid coolant reservoir is positioned in a fluid circuit between the pump and the first plenum.

16. An apparatus for cooling a remote heat exchanger thermally combinable with a circuit component to be cooled, the apparatus comprising:

a radiator;

an upper pump housing member mounted on the radiator;

a lower pump housing member mounted on a side of the upper pump housing member opposite the radiator;

a pump impeller mounted within the lower pump housing member;

a liquid coolant reservoir integrated with the radiator and defined by the upper pump housing member, the reservoir being positioned in a fluid circuit between the pump and the radiator and including a chamber for storing a volume of liquid coolant that is separate from the pump and separate from the radiator;

an outlet provided on the upper pump housing member; and an inlet provided on the radiator, wherein the pump is operable to circulate the liquid coolant out of the outlet to the remote heat exchanger and back into the inlet to the radiator, and wherein the pump is mounted at a longitudinal position between longitudinal ends of the radiator.

17. The apparatus of claim 16, wherein the radiator includes a plurality of longitudinal tubes.

18. The apparatus of claim 16, wherein:

the radiator includes an inlet chamber;

the inlet is provided on the inlet chamber; and the pump is operable to circulate the liquid coolant from the heat exchanger back into the inlet provided on the inlet chamber of the radiator.

19. The apparatus of claim 18, wherein the inlet chamber is integral with the radiator.

20. The apparatus of claim 18, further comprising:

a heat exchanger inlet and a heat exchanger outlet provided on the remote heat exchanger;

a first hose configured to extend from the outlet provided on the upper pump housing and the heat exchanger inlet; and a second hose configured to extend from the heat exchanger outlet to the inlet provided on the radiator.

* * * * *